(12) United States Patent
Sousa

(10) Patent No.: US 11,095,254 B1
(45) Date of Patent: Aug. 17, 2021

(54) CIRCUITS AND METHODS TO REDUCE DISTORTION IN AN AMPLIFIER

(71) Applicant: Analog Devices International Unlimited Company, Limerick (IE)

(72) Inventor: Joseph L. Sousa, Billerica, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/750,251

(22) Filed: Jan. 23, 2020

(51) Int. Cl.
*H03F 1/32* (2006.01)
*H03F 1/56* (2006.01)

(52) U.S. Cl.
CPC ............ *H03F 1/3205* (2013.01); *H03F 1/56* (2013.01); *H03F 2200/24* (2013.01); *H03F 2203/21139* (2013.01)

(58) Field of Classification Search
CPC .................................................. H03F 1/3205
See application file for complete search history.

(56) References Cited

U.S. PATENT DOCUMENTS

| | | | |
|---|---|---|---|
| 3,870,965 | A | 3/1975 | Frederiksen |
| 3,958,135 | A | 5/1976 | Rosenthal |
| 4,045,747 | A | 8/1977 | Hsu |
| 5,105,165 | A | 4/1992 | Bien |
| 5,399,991 | A | 3/1995 | Moraveji |
| 5,999,043 | A | 12/1999 | Zhang et al. |
| 6,313,705 | B1 * | 11/2001 | Dening ................... H03F 1/302 330/276 |
| 6,333,677 | B1 | 12/2001 | Dening |
| 6,531,924 | B2 | 3/2003 | Aparin |
| 6,556,075 | B1 | 4/2003 | Jordan |
| 6,831,504 | B1 * | 12/2004 | Holloway ............... G05F 3/245 323/315 |
| 7,057,457 | B2 | 6/2006 | Irvine et al. |
| 8,022,765 | B1 | 9/2011 | Oo et al. |

(Continued)

FOREIGN PATENT DOCUMENTS

| | | |
|---|---|---|
| DE | 102004034880 | 11/2006 |
| JP | 2007159085 | 6/2007 |
| JP | 2008176702 | 7/2008 |

OTHER PUBLICATIONS

"Minimizing Distortion in Operational Transconductance Amplifiers", openmusiclabs, [Online] Retrieved from the Internet: <URL:http://www.openmusiclabs.com/2015/10/my-summer-vacation-by-guest/trackback/index.htm!>, (Oct. 3, 2015), 15 pgs.

(Continued)

*Primary Examiner* — Patricia T Nguyen
(74) *Attorney, Agent, or Firm* — Schwegman Lundberg & Woessner, P.A.

(57) ABSTRACT

A device to reduce distortion in an amplifier includes an input transistor configured to generate a voltage based on an input signal. The device further includes a diode connected transistor that is configured to sink the current. The diode connected transistor includes an output terminal, and a control terminal, where the output terminal is coupled to a control terminal. The device further includes a current source circuit that coupled to the control terminal. The device additionally includes an impedance element that coupled to the output terminal at a first node and to the control terminal and the current source circuit at a second node.

20 Claims, 5 Drawing Sheets

(56) References Cited

U.S. PATENT DOCUMENTS

| | | | |
|---|---|---|---|
| 8,841,894 B1* | 9/2014 | Naraghi | H03F 3/181 |
| | | | 323/282 |
| 9,214,942 B2 | 12/2015 | Thakur | |
| 2001/0054888 A1 | 12/2001 | Ueno et al. | |
| 2008/0001675 A1 | 1/2008 | Kazi et al. | |
| 2009/0289715 A1 | 11/2009 | Sengupta et al. | |
| 2010/0019852 A1 | 1/2010 | Leitner | |
| 2011/0163811 A1* | 7/2011 | Marinas | H03F 3/3023 |
| | | | 330/264 |
| 2014/0077882 A1* | 3/2014 | Draxelmayr | H03F 3/45475 |
| | | | 330/282 |

OTHER PUBLICATIONS

"Hybrid Systems Datalinear 1988 Product Catalog", Sipex Corporation, (1988), 29 pgs.

"LTC2358-16: Buffered Octal, 16-Bit, 200ksps Ch Differential +/- 10.24V ADC 30Vp-p Common Mode Range", Analog Devices, (2018), 40 pgs.

* cited by examiner

CIRCUITS AND METHODS TO REDUCE DISTORTION IN AN AMPLIFIER

FIELD OF THE DISCLOSURE

This document pertains generally, but not by way of limitation, to amplifier circuits, and more particularly, to reducing signal distortion in amplifiers caused by bias current sources.

BACKGROUND

Amplifiers include electronic circuits that receive electrical signals and provide conditioned versions of these signals for further use or processing. The received signals can be conditioned by modifying one or more their electrical characteristics according to a provided specification. Such modifying can include level shifting the signal, such as by changing the direct current (DC) bias point of the signal. Such modifying can include amplifying a current, voltage, or overall power of the signal. In an example, an amplifier can include a source follower circuit that is configured to buffer a signal by shifting the DC bias point of the signal and increasing the overall power of the signal, such as by providing a signal current gain. An amplifier generally modifies a specified electrical characteristic of an input signal to produce a conditioned output signal that maintains a high fidelity to the original input signal. However, source follower circuits, as well as other amplifier circuits, can use bias circuits that incorporate current sources with non-linear output characteristics, such as a non-linear output impedance, that introduce signal distortions. Such non-linear output characteristics can be an artifact of imperfections in these bias circuits, such as the non-linear junction capacitance, non-linear drain impedance, or non-linear collector impedance of transistors used to construct the bias circuits.

Techniques for reducing signal distortions caused by non-linear characteristics of a bias circuit includes incorporating an adjustable gain before the node with a non-linear characteristic with negative feedback. Such techniques, however, can add complexity to a circuit, such as due to additional circuit elements needed to provide the adjustable gain and feedback. Such techniques can also reduce the frequency performance on an amplifier, such due to gain drop off or roll off with increasing frequency. Other techniques for reducing signal distortion can include degeneration of the amplifier's internal current sources. These techniques, however, do not improve the impedance of an amplifier's internal current sources, such as from junction capacitances that is in parallel with the current source.

There is a need for amplifier circuits that include bias circuits that incorporate current sources that have non-linear output characteristics (e.g., imperfect current sources) without significantly increasing complexity or reducing performance.

Figure 1:
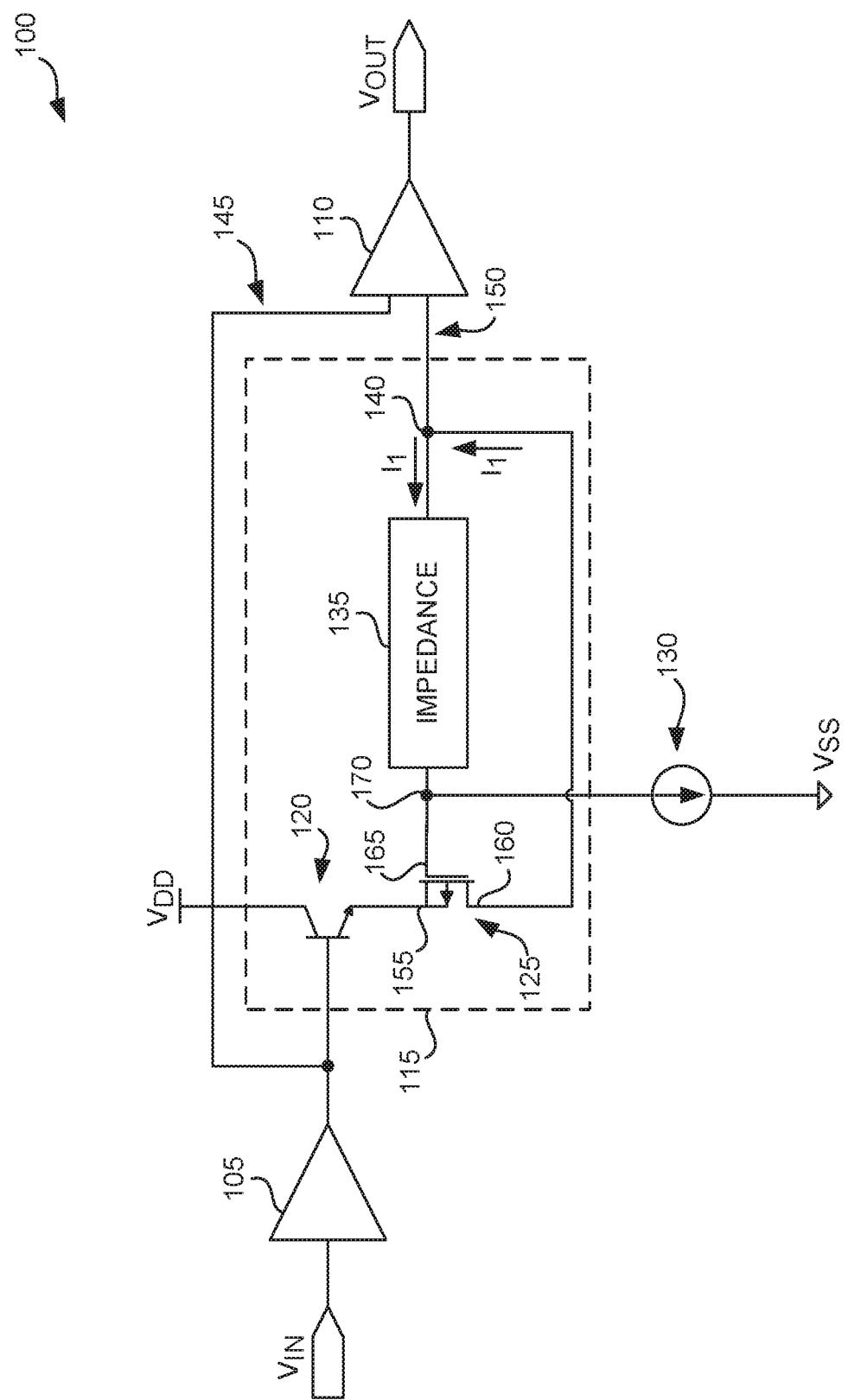
FIG. 1 depicts an example of an amplifier that includes an input bias circuit that is configured to reduce signal distortion caused by non-linear output impedance of a bias current source.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure includes techniques for reducing signal distortion or other undesirable artifacts (e.g., gain error, offset error, or drift effects) that arise from imperfect bias current sources in an amplifier circuit. In an example, an impedance device, such as a resistor or load transistor, is inserted into a feedback path of an input bias circuit of an amplifier to sample the signal distortion caused by the current sources and cancel distortion. These techniques enable the fabrication of amplifiers that are resilient to the finite impedance of bias current sources, such as caused by non-linearity, process, temperature or amplitude variations in imperfect bias current sources. This resilience is obtained without the incorporation of additional gain and feedback circuits.

Aspects of the present disclosure are based on the recognition that bias current sources in an amplifier circuit can have a significant component of undesirable, including non-linear, output impedance. Such bias current sources are generally a sub-circuit of an input bias circuit of a voltage follower stage of the amplifier. The non-linear output impedance of the bias current source can arise from the non-linear junction capacitance, drain impedance, or collector impedance of transistors, or other switching or semiconductor elements, in the input bias circuit. The non-linear impedance presents a non-linear load at the follower stage and causes signal distortion.

In an example of the present disclosure, an input bias circuit includes a diode-connected transistor that is coupled to a bias current source, such as to control the bias voltage of another circuit or to provide a more accurate voltage based on an input signal. An impedance element is inserted into a feedback path of the diode-connected transistor, such as between the gate and drain of a diode-connected metal-oxide semiconductor field effect transistor (MOSFET) or the base and collector of a bipolar junction transistor (BJT). The impedance device is sized or configured to have an impedance that matches the output impedance of the input, bias circuit. In operation, a distortion, such as a voltage drop, is developed across the impedance element to cancel the signal distorting effect of the undesirable (e.g., non-linear) impedance of the bias current source.

FIG. 1 depicts an example of an amplifier 100 having an input bias circuit 115 that is configured to reduce signal distortion caused by a non-linear output impedance of a bias current source. In an example, the amplifier 100 includes a buffer amplifier, such as a voltage or source follower. In another example, the amplifier 100 includes a follower stage of a larger amplifier circuit. The amplifier 100 includes an input bias circuit 115 and a bias current source 130. In an example the amplifier 100 includes an input stage 105 and an output stage 110.

In an example, the input stage 105 includes a circuit to receive and condition an input signal $V_{IN}$. Such circuit can include a high impedance circuit that is configured to shift the voltage level of $V_{IN}$ to a level that is useful for driving circuits in a subsequent stage of the amplifier 100. In an example, the input stage 105 includes a p-type MOSFET circuit (PMOS) that is configured to shift $V_{IN}$ by an indicated voltage and provide the shifted $V_{IN}$ to output circuit 110 or to the input bias circuit 115.

In an example, the output stage 110 includes a circuit to provide a conditioned version of the input signal $V_{IN}$, such as for use in one or more other devices or circuits. Such circuit can include a pull-up circuit to receive a first version of $V_{IN}$ 145 from the input stage 105, and a pull-down circuit to receive a second version $V_{IN}$ 150 from the input bias circuit 115. In an example, the output stage 110 is configured to buffer $V_{IN}$, such as by providing a current or power gain between $V_{IN}$ and $V_{OUT}$.

In an example, the input bias circuit 115 is configured to bias an input circuit or element of the output stage 110, such as to cause the input circuit to operate within an indicated region of its operating or characteristic curve. Biasing the input circuit can include shifting (e.g., offsetting) the voltage level of a version of $V_{IN}$ received from the input stage 105 to an indicated voltage level. In an example, the input bias circuit 115 includes an input transistor 120, a diode-connected transistor 125, and an impedance circuit 135.

The input transistor 120 can include any suitable transistor, such as a MOSFET, a BJT, or a JFET. The input transistor 120 can include any circuit that has one or more semiconducting devices, such as transistors or diodes, and is configured to operate as, or to perform the function of, an input transistor. In an example, the input transistor 120 is a MOSFET that is configured to couple a version of $V_{IN}$ received from the input stage 105 to the diode connected transistor 125. Such coupling can include shifting the voltage level of $V_{IN}$ to offset a voltage level shift in $V_{IN}$ caused by the input stage 105. In an example, the input transistor 120 is configured to provide a conductive route for a bias current $I_1$, such as determined by the bias current source 130, from power rail Von.

The diode-connected transistor 125 can include any suitable transistor, such as a MOSFET, a BJT, or a HET that is configured to operate as a two-terminal diode. The diode connected transistor 125 can include any circuit that has one or more transistors and is configured to operate as, or to perform the function of, a diode-connected transistor. In an example, the diode-connected transistor 125 includes an input terminal 155, an output terminal 160, and a control terminal 165. In an example, the diode-connected transistor 125 is a MOSFET and the input terminal 155, the output terminal 160, and the control terminal 165 are, respectively, the source, drain, and gate of the MOSFET. In other examples, the diode-connected transistor 125 is a BJT and the input terminal 155, the output terminal 160, and the control terminal 165 are, respectively, the emitter, collector, and base of the BJT. The output terminal 160 can be coupled to the control terminal 165 to form a feedback path that includes the impedance element 135.

The impedance element 135 can include any circuit or circuit element that is configured to insert a passive or active impedance into the feedback path between the output terminal 160 and the control terminal 165. In an example, the impedance element 135 includes a resistor network having one or more resistors. In another example, the impedance element 135 includes an active circuit having one or more transistor. In an example, the impedance element 135 has an impedance that matches the impedance seen by a circuit looking into the node 170. In an example, impedance of the impedance element 135 matches the impedance of the series combination of the emitter impedance of input transistor 120 and output impedance of diode connected transistor 160 (hereinafter collectively referred to as "the series impedance of the input transistor 120 and the output transistor 125").

The bias current source 130 can include any suitable current source that is configured to provide a substantially fixed current, such as a current that only has an indicated threshold amount (e.g., a specification limit) of variance as specified for a target application, to operate with the input transistor 120 and the diode connected transistor 125 to set a bias point for a circuit element, such as a transistor, in the output stage HO. In an example, the bias current source 130 is an internal current source, such as a MOSFET current mirror, of the amplifier 100, and is configured to operate with the input transistor 120 and the diode connected transistor 125 to shift the voltage level of the input signal $V_{IN}$ to a suitable voltage range for driving a transistor, such as a MOSFET, in the output stage 110.

The operation of existing amplifiers, such as an amplifier without the impedance element 135, by considering the amplifier 100 with node 170 shorted to the node 140. In such an amplifier, the combination of the input transistor 120, the diode connected transistor 125 and the bias current source 130 form a biasing circuit whose operation is analogous to level shifting circuit. The bias current source 130 biases the input transistor 120 and the diode connected transistor 125, such as by sinking the current $I_1$, to a suitable operation point.

The combined circuit receives an input signal, such as a shifted version of $V_{IN}$, from input stage 105 and generates a level shifted version of the input signal at node 170. In an example, the series impedance of the input transistor 120 and the diode connected transistor 125 seen looking into the output terminal 160 is zero and the output impedance of the bias current source 130 is infinite. In this example, the level shifted version of the input generated at node 170 is a high fidelity, or perfect, level shifted copy of the input signal.

In another example, the series combination of the input transistor 120 and the diode connected transistor 125 has a finite nonzero impedance and the bias current source 130 is has a large, but finite, impedance. The finite series impedance of the input transistor 120 and the diode connected transistor 125 operate with the finite output impedance of the bias current source 130 to form an attenuator circuit that causes a gain loss or a distortion loss (hereinafter, "signal distortion") in the level shifted copy of the input signal at node 170. In an example, the signal distortion is a voltage drop across the input transistor 120 and the diode connected transistor 125 due to the flow of $I_1$. This signal distortion may be presented to the output stage 110 where it could be propagated to other circuits.

Adding the impedance element 135 to the input biasing circuit 115, such as shown in FIG. 1, creates a mechanism for cancelling or attenuating at least a part of the signal distortion generated at node 170. In operation, the input biasing circuit 115 configured with the impedance element 135 receives an input signal, such as a shifted version of $V_{IN}$, from input stage 105 and generates a level shifted version of the input signal at node 170, as previous described. The finite series impedance of the input transistor 120 and the diode connected transistor 125 operate with the finite output impedance of the bias current source 130 to form an attenuator circuit that causes a signal distortion in this level shifted copy of the input signal at node 170. The impedance element 135, however, causes a voltage drop between 140 and 170 that is of equal, but level-shifted, magnitude to the voltage drop between the base terminal of 120 and node 140. The current $I_2$ causes a voltage to develop across the impedance element 135. The voltage developed across the impedance element 135 due to and the voltage developed across the input transistor 120 and the diode connected transistor 125 due to $I_1$ are of equal magnitude of opposite polarity, as seen from a circuit looking into the node 140. This is due in part to the equal magnitude and opposite polarities of $I_1$ and $I_2$, as well as matched impedances of the impedance element 135 and the series impedance of the input transistor 120 and the diode connected transistor 125. The equal magnitude and opposite polarity voltages developed across the impedance element 135 and the series combination of the input transistor 120 and the diode connected transistor 125 cancel at node 140, thereby cancelling or eliminating the effect of the signal distortion at node 170. Stated another way, the distortion generated at node 170 is cancelled at node 140 though the operation of the impedance element 135.

Figure 2:
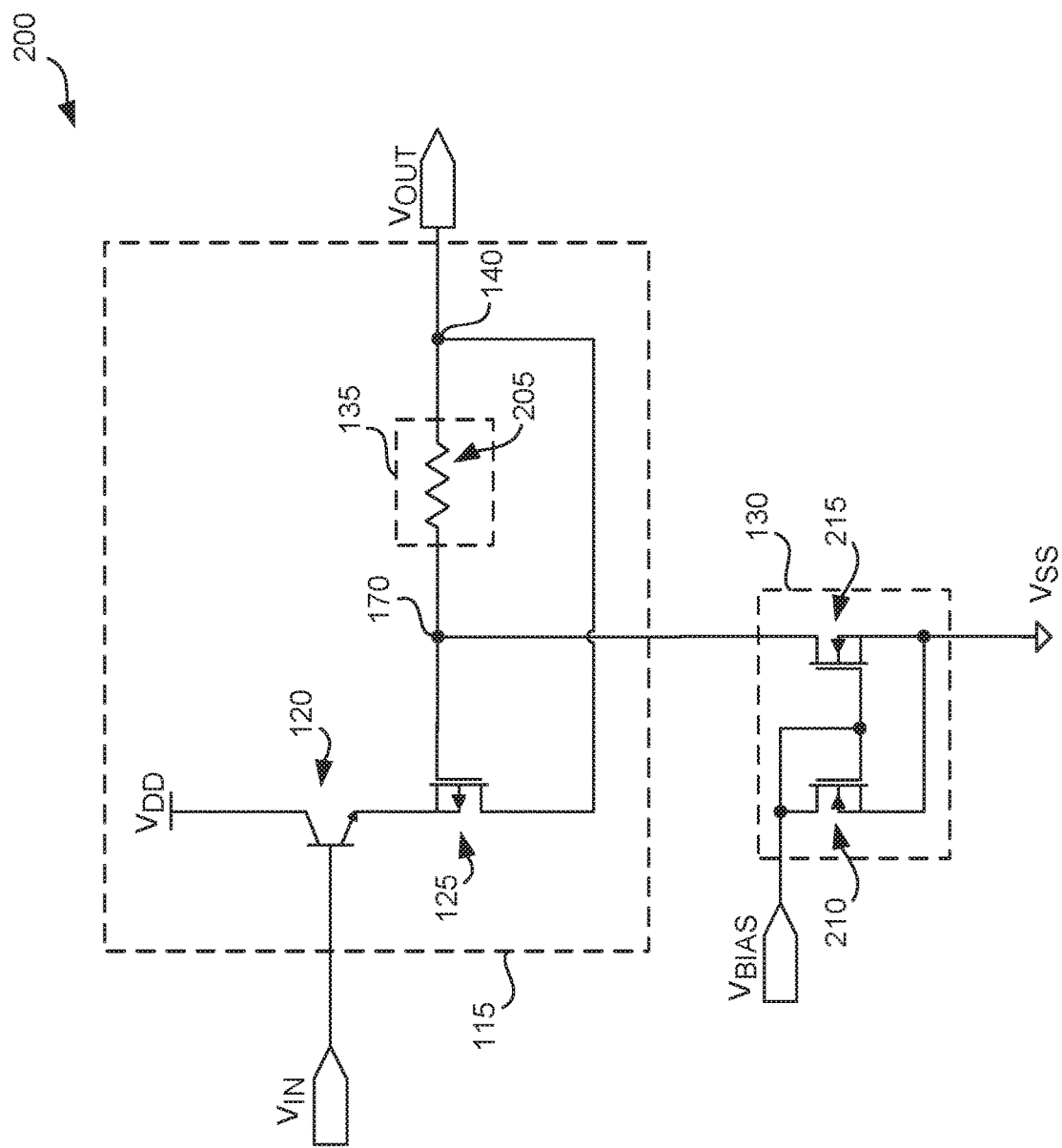
FIG. 2 depicts a diagram of an example of a circuit that includes a passive impedance element in feedback path of a diode connected transistor to reduce signal distortion caused by non-linear impedances of a bias current source.

FIG. 2 depicts a diagram of an example of a circuit 200 that includes a passive impedance element 135 in feedback path of a diode connected transistor to reduce signal distortion caused by non-linear impedance of a bias current source. The circuit 200 includes the input bias circuit 115, and the bias current source 130. The bias current source 130 includes a MOSFET current source, such as formed by transistors 210 and 215, that is actuated by a bias voltage VBIAS to generate a constant current to bias the input transistor 120 and the diode connected transistor 125. VBIAS is created with an external current that is to be mirrored by 215. The passive impedance element 135 can include a network of one or more resistors 205 that is disposed between node 140 and node 170. The overall resistance of the one or more resistors 205 is determined based on the impedance seen by a circuit looking to the drain of the diode connected transistor 125. In an example the resistance of the one or more resistors 205 is matched, substantially equal, to sum of the emitter resistance of the input transistor 120 and the output, or the drain, resistance of the diode connected transistor 125. Similar to the combination of input biasing circuit 115 and the bias current source 130 described in the discussion of FIG. 1, the circuit 200 is configured to receive an input signal $V_{IN}$, such as an output of the input stage 105 (FIG. 1) and to generate a shifted copy of the input signal at the node 170. This shifted copy of the input signal is coupled to node 140 and provided as an output $V_{OUT}$. While a distortion is generated at node 170, as previously described, this distortion is cancelled at the node 140 by the voltage developed across the one or more resistors 205. The distortion at node 170 is therefore not propagated, such as to the output stage 110 (FIG. 1), in the signal $V_{OUT}$.

Figure 3:
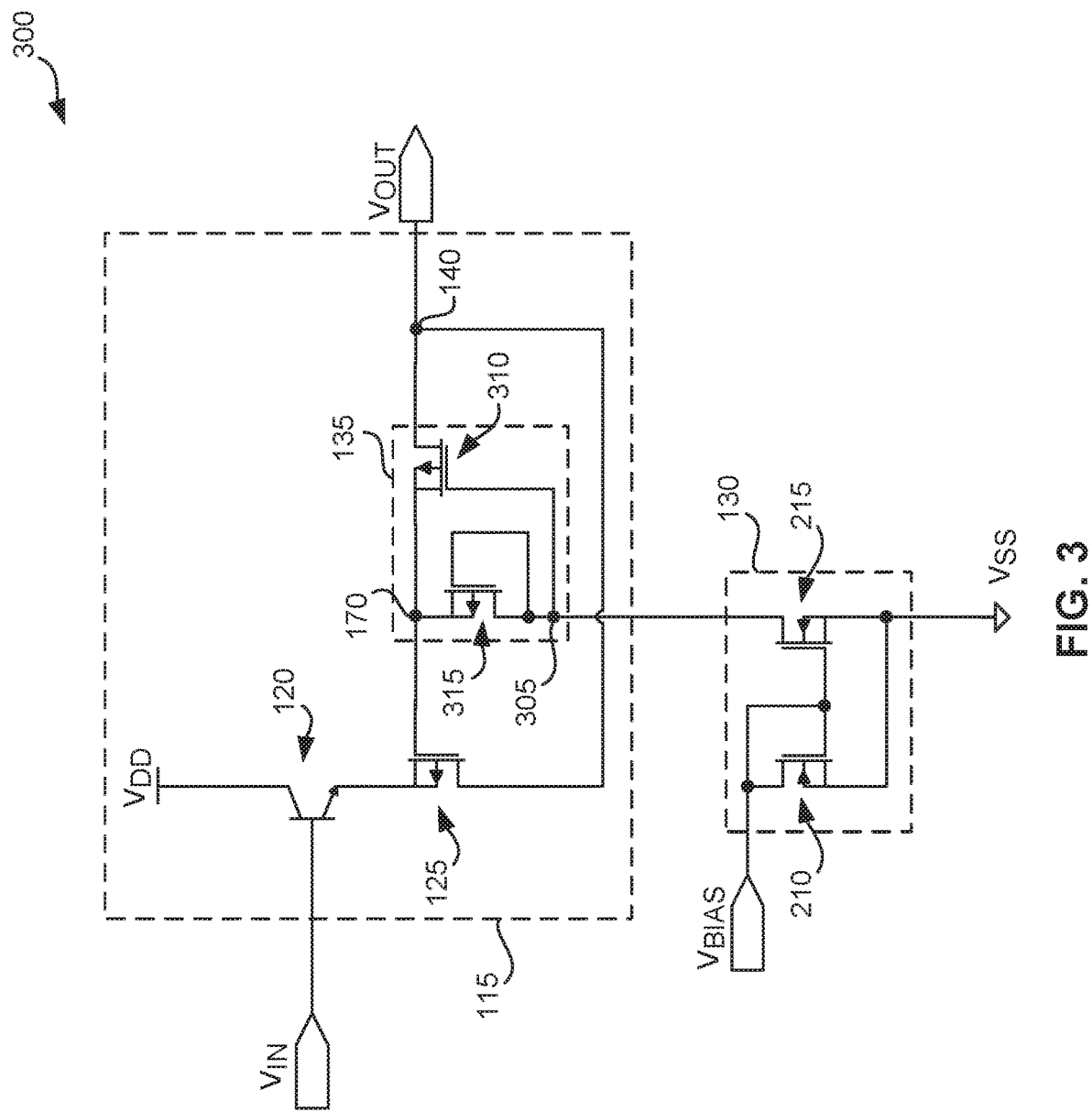
FIG. 3 depicts a diagram of an example of an input bias circuit that includes a transistor in feedback path of a diode connected transistor to reduce signal distortion caused by non-linear impedances of bias current source.

FIG. 3 depicts a diagram of an example of a circuit 300 that includes an active impedance element 135 in feedback path of a diode connected transistor to reduce signal distortion caused by non-linear impedances of a bias current. The circuit 300 includes an input bias circuit 115, and a bias current source 130. Similar to the combination of input biasing circuit 115 and the bias current source 130 described in the discussion of FIG. 1 and FIG. 2, the circuit 300 is configured to receive an input signal $V_{IN}$, such as an output of the input stage 105 (FIG. 1), and to generate a shifted copy of the input signal at the node 140. This shifted copy of the input signal is coupled to node 140 and provided as an output $V_{OUT}$. The distortion generated at node 170 is cancelled at the node 140 by the voltage developed across the active impedance element 135, thereby preventing distortion from propagating to other circuits, such as to the output stage 110 (FIG. 1), in the signal $V_{OUT}$.

The active impedance element 135 can include a circuit having one or more active circuit elements, such as the load transistor 310 (e.g., a cancellation transistor), that is configured to provide an adjustable impedance between node 140 and node 170. In an example, the active impedance element 135 also includes a feedback element 315 (e.g., a compensation circuit), such as a diode connected transistor. The impedance of the active impedance element 135, or the impedance of the load transistor 310, is selected to match, or to be substantially equal to, the impedance of the emitter impedance of the input transistor 120 and the output, or the drain, impedance of the diode connected transistor 125. In an example, the impedance of the active impedance element 135 is the sum of the emitter resistance of the input transistor 120 and the output resistance, or the drain resistance, of the diode connected transistor 125. In an example, the impedance of the active impedance element 135 is determined based at least in part on a selection of the geometry of the load transistor 310 and the feedback element 315.

The feedback element 315 is configured to adjust the impedance of the active impedance circuit 135 to compensate for the effect of process, temperature, and voltage (PVT) variations on the output impedance of the diode connected transistor 125. In an example, the feedback element 315 is fabricated to have a larger threshold voltage than the threshold voltage of the active impedance element 135. The feedback element 315, the diode connected transistor 125 and impedance element 135 all experience substantially the same PVT variations. This causes PVT related variations in the output impedance of the diode connected transistor 125 to be tracked by corresponding variations the impedance of the active impedance element 135, or the impedance of the transistor 310, thereby ensuring that the impedance of active impedance element 135 remains matched to the impedance of the input transistor 120 and the diode connected transistor 125 across PVT variation.

Figure 4:
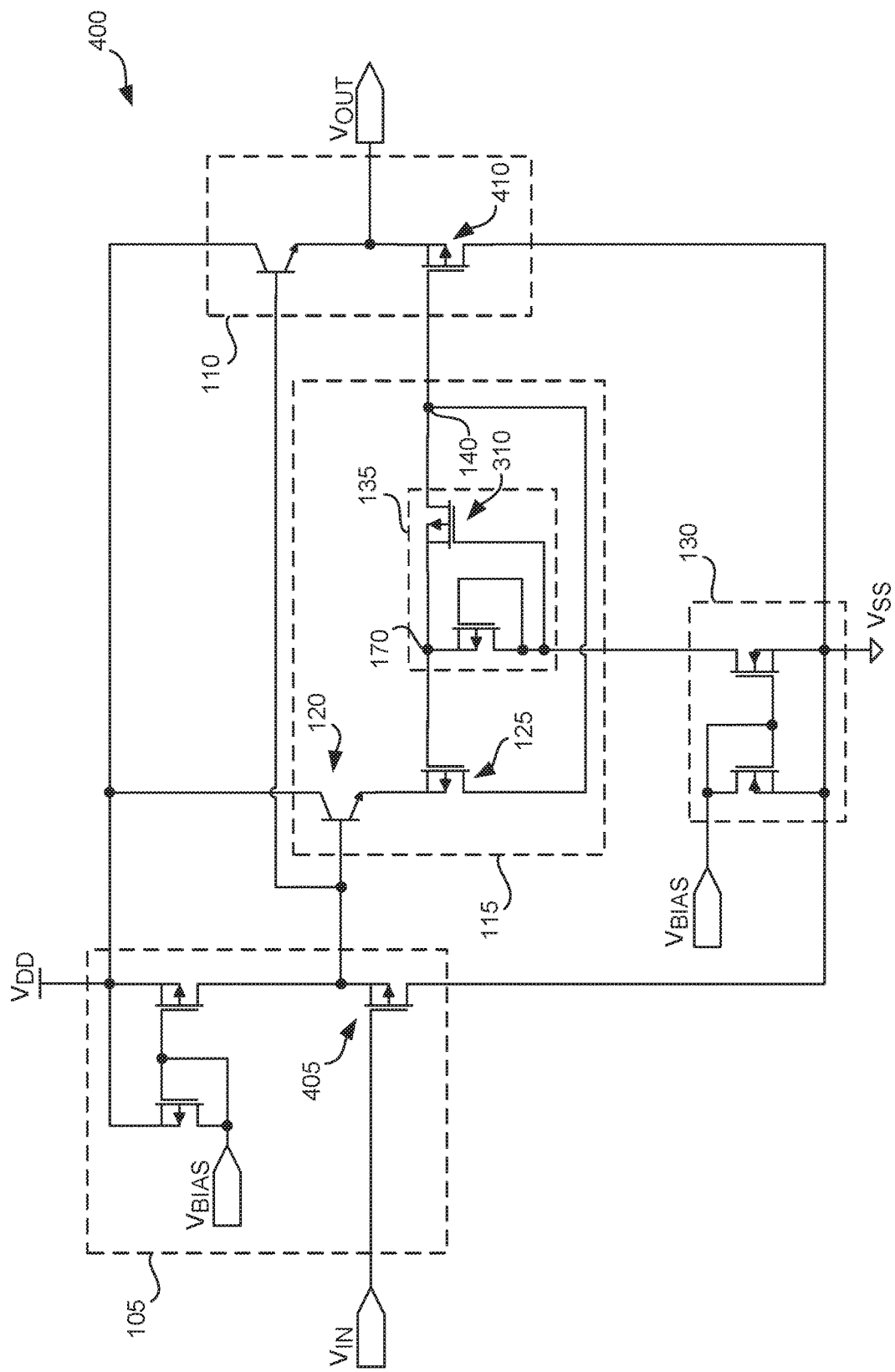
FIG. 4 depicts an example of an amplifier that includes an input bias circuit that is configured to reduce signal distortion caused by non-linear impedance of a bias current source.

FIG. 4 depicts an example of an amplifier 400 that includes an input bias circuit that is configured to reduce signal distortion. The amplifier 400 is an example of the amplifier 100. As shown in FIG. 4, the input bias circuit 115 in combination with bias current source 130 receives an input signal from the input stage 105. In an example, the input signal is a down-shifted version of $V_{IN}$, such as a version of $V_{IN}$ that is up-shifted by the gate-to-source voltage $V_{GS}$ of the transistor 405. The input bias circuit 115 in combination with bias current source 130 is configured to provide a shifted copy of the input signal to the output stage 110 at the node 140. In an example such shifted copy of the input signal is generated down-shifting the input signal by $V_{GS}$ or any other suitable voltage for driving gate of the transistor 410. As described herein, the distortion generated at node 170 is cancelled at the node 140 by the voltage developed across the active impedance element 135, thereby preventing the distortion from propagating to other circuits, such as to the output stage 110.

Figure 5:
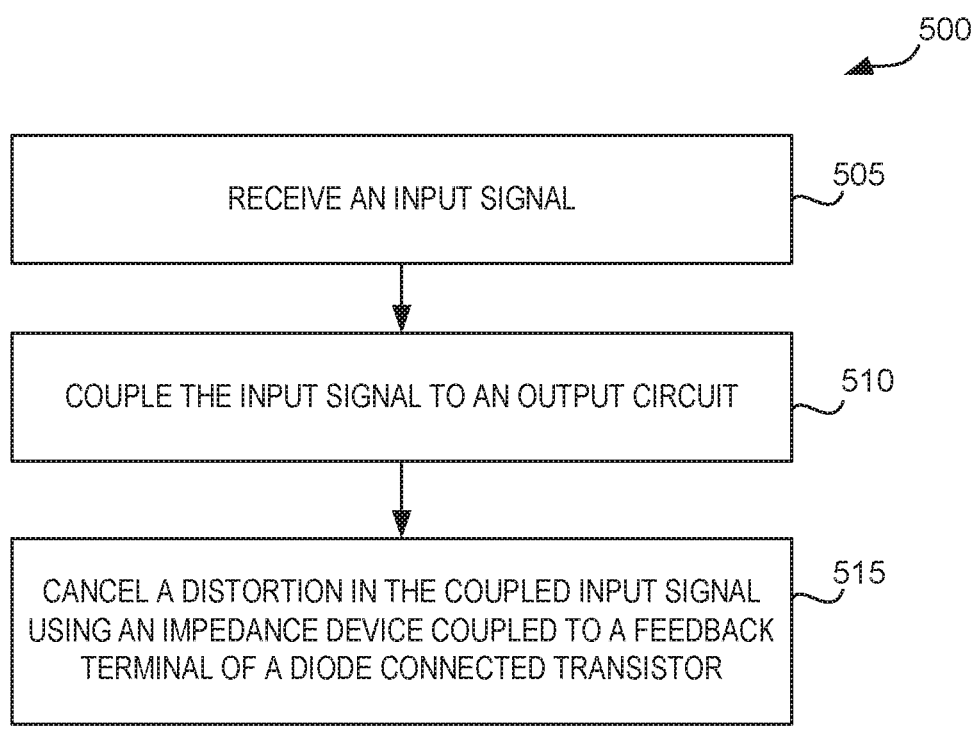
FIG. 5 depicts a set of operations for reducing signal distortion caused by a bias current source in an amplifier, according to various examples.

FIG. 5 depicts a process 500 for reducing signal distortion caused by a bias current source in an amplifier, such as the amplifier 400. At 505, an input signal can be received, such as from the input stage 105 (FIG. 1 or 4). In an example, the input signal is received by an input transistor that is coupled in series with an input terminal of a diode connected transistor. At 510, the input signal can be coupled to an output stage of the amplifier, such as the output stage 110 (FIG. 1 or 4), Such coupling can include biasing the output stage using the input transistor, the diode connected transistor, and a bias current source, as described herein. At 510, a distortion in the coupled signal is cancelled by a voltage developed across an impedance element (e.g., an impedance device) that is coupled to a control terminal of the diode connected transistor, as described herein. In an example, the impedance of the impedance element is determined or established based on the impedance of the input transistor and the diode connected transistor. In an example, the impedance element includes a network of one or more resistors. In an example, the impedance element includes circuit having one or more active elements, such as load transistor and a feedback element, where the feedback element is configured to adjust the impedance of the impedance element to track or match the impedance of the diode connected transistor.

The process 500 can further include other suitable steps or operations for implementing the techniques described herein.

While operations of the process 500 are shown as occurring or being executed sequentially in a specific order, in other examples, one or more of the operations may be performed in parallel or in a different order. Additionally, one or more operations may be repeated two or more times.

Each of the non-limiting aspects or examples described herein may stand on its own or may be combined in various permutations or combinations with one or more of the other examples.

The present disclosure depicts and describes examples of circuits that include specific types of transistor. The depicted or described types of transistor are used as examples to illustrate the techniques of the present disclosure. Such techniques, however, can be implemented using any other suitable type of transistor without detracting from the scope of the disclosure. More specifically, any of the MOSFETs or BJTs depicted or discussed herein, can be replaced by suitable MOSFETs, BJTs, junction FETs, or other semiconductor devices or circuits.

Aspects of the present disclosure are discussed in terms of techniques for reducing or canceling signal distortion caused by amplifier input bias circuits. Such techniques, however, are also useful for reducing or cancelling signal distortion or other undesirable signal artifacts (e.g., gain error, offset error, or drift effects) in any device that uses an input bias diode-connected transistor (hereinafter, "diode-connected transistor") that is coupled to a bias current source.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation; or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. An example may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A device to reduce distortion in an amplifier, the device comprising:
    an input transistor to generate a voltage based on an input signal;

a diode connected transistor, the diode connected transistor comprising:
an output terminal, and
a control terminal, the output terminal coupled to the control terminal;
a current source circuit coupled to the control terminal; and
an impedance element coupled to the output terminal at a first node and coupled to the control terminal and the current source circuit at a second node.

2. The device of claim 1, wherein the impedance element is configured to cancel a distortion generated at the second node by the current source circuit.

3. The device of claim 1, wherein an impedance of the impedance element matches the series combination of output impedance of the input transistor and the output impedance of the diode connected transistor.

4. The device of claim 1, wherein the impedance element comprises a resistor.

5. The device of claim 1, wherein the impedance element comprises a cancellation transistor and a compensation circuit, the compensation circuit configured to control the impedance of the cancellation transistor.

6. The device of claim 5, wherein the compensation circuit comprises a second diode connected transistor disposed between the current source and the second node.

7. The device of claim 1, further comprising an output stage coupled to the first node.

8. The device of claim 7, wherein the output stage comprises a source circuit and a sink circuit, the source circuit coupled in parallel with the input transistor and the sink circuit coupled to the first node.

9. The device of claim 1, wherein the diode connected transistor is a metal-oxide semiconductor field effect transistor, the output terminal comprises a drain terminal and the control terminal comprise a gate terminal.

10. A system having an amplifier circuit, the amplifier circuit comprising:
an output stage;
a biasing stage to drive the output stage, the biasing stage comprising:
a diode connected transistor;
an impedance element disposed between an output terminal and a control terminal of the diode connected transistor; and
a current source coupled to the diode connected transistor at a first node formed by the control terminal and the impedance element.

11. The system of claim 10, wherein the impedance element is configured to cancel a distortion caused by the current source at the first node.

12. The system of claim 10, wherein the biasing stage further comprises an input transistor to couple the diode connected transistor to a power supply, the input transistor configured to source a current to the diode connected transistor in response to an input signal.

13. The system of claim 10, wherein the impedance element is configured to match a series impedance of the input transistor and the diode connected transistor.

14. The system of claim 10, wherein the impedance element comprises a load transistor and a biasing circuit, the biasing circuit configured to control the impedance of the load transistor.

15. The device of claim 14, wherein the biasing circuit comprises a diode connected transistor disposed between the current source and the first node.

16. A method for reducing distortion in an amplifier, the method comprising:
biasing an output stage of an amplifier using a diode connected transistor and a current source; and
cancelling a signal distortion in the output stage using an impedance element, the impedance element being coupled between a control terminal of the diode connected transistor and an output terminal of the diode connected transistor.

17. The method of claim 16, further comprising:
receiving an input signal using an input transistor coupled to an input terminal of the diode connected transistor;
establishing an impedance of the impedance element based on an impedance of the input transistor and the diode connected transistor.

18. The method of claim 17, wherein the impedance element comprises a resistor.

19. The method of claim 17, wherein the impedance element comprises a load transistor and a biasing circuit, the biasing circuit configured to control the impedance of the load transistor.

20. The method of claim 19, further comprising adjusting the impedance of the impedance element in response to a change in the impedance of the diode connected transistor.

* * * * *